United States Patent
Tien et al.

(10) Patent No.: US 11,062,996 B2
(45) Date of Patent: Jul. 13, 2021

(54) EMBEDDED COMPONENT PACKAGE STRUCTURE AND MANUFACTURING METHOD THEREOF

(71) Applicant: Advanced Semiconductor Engineering, Inc., Kaohsiung (TW)

(72) Inventors: Hsing Kuo Tien, Kaohsiung (TW); Chih Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 13 days.

(21) Appl. No.: 16/528,336

(22) Filed: Jul. 31, 2019

(65) Prior Publication Data
US 2021/0035912 A1    Feb. 4, 2021

(51) Int. Cl.
*H01L 23/538* (2006.01)
*H01L 21/48* (2006.01)
*H01L 23/31* (2006.01)

(52) U.S. Cl.
CPC ........ *H01L 23/5383* (2013.01); *H01L 21/486* (2013.01); *H01L 21/4857* (2013.01); *H01L 23/3128* (2013.01); *H01L 23/5384* (2013.01)

(58) Field of Classification Search
CPC ............ H01L 23/5383; H01L 23/5384; H01L 21/4857; H01L 21/486
See application file for complete search history.

(56) References Cited

U.S. PATENT DOCUMENTS

2020/0168536 A1*    5/2020   Link ................... H01L 21/4857

* cited by examiner

*Primary Examiner* — Quoc D Hoang
(74) *Attorney, Agent, or Firm* — Foley & Lardner LLP

(57) ABSTRACT

A semiconductor device package includes a magnetically permeable layer having a top surface and a bottom surface opposite to the top surface. The semiconductor device package further includes a first conductive element in the magnetically permeable layer. The semiconductor device package further includes a first conductive via extending from the top surface of the magnetically permeable layer into the magnetically permeable layer to be electrically connected to the first conductive element. The first conductive via is separated from the magnetically permeable layer. A method of manufacturing a semiconductor device package is also disclosed.

22 Claims, 13 Drawing Sheets

EMBEDDED COMPONENT PACKAGE STRUCTURE AND MANUFACTURING METHOD THEREOF

BACKGROUND

1. Technical Field

The present disclosure generally relates to a semiconductor device package and a method of manufacturing the same, and to a semiconductor device package including a magnetically permeable layer and a method of manufacturing the same.

2. Description of the Related Art

An electrical device may include a plurality of active components (chips or dies) and passive components (resistors, inductors or capacitors) disposed on a substrate or a circuit board. However, placing the active components and passive components on the substrate would increase the size of the electrical device and the signal transmission path between the electronic components. Therefore, to solve the above problems, it is desirable to develop an electrical device having passive components embedded within the substrate.

SUMMARY

In one or more embodiments, a semiconductor device package includes a magnetically permeable layer having a top surface and a bottom surface opposite to the top surface. The semiconductor device package further includes a first conductive element in the magnetically permeable layer. The semiconductor device package further includes a first conductive via extending from the top surface of the magnetically permeable layer into the magnetically permeable layer to be electrically connected to the first conductive element. The first conductive via is separated from the magnetically permeable layer.

In one or more embodiments, a semiconductor device package includes a magnetically permeable layer having a top surface and a bottom surface opposite to the top surface. The semiconductor device package further includes a first conductive element in the magnetically permeable layer. The semiconductor device package further includes an opening extending from the top surface of the magnetically permeable layer to expose a portion of the first conductive element. The semiconductor device package further includes a first conductive via disposed within the opening and electrically connected to the exposed portion of the first conductive element. The semiconductor device package further includes a dielectric layer covering the magnetically permeable layer and on a sidewall of the opening.

In one or more embodiments, a method of manufacturing a semiconductor device package includes providing a structure including a magnetically permeable layer having a top surface, a bottom surface opposite to the top surface, and a conductive element enclosed in the magnetically permeable layer. The method further includes forming a first opening to expose a part of the conductive element. The method further includes forming a dielectric layer covering the magnetically permeable layer and within the first opening.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
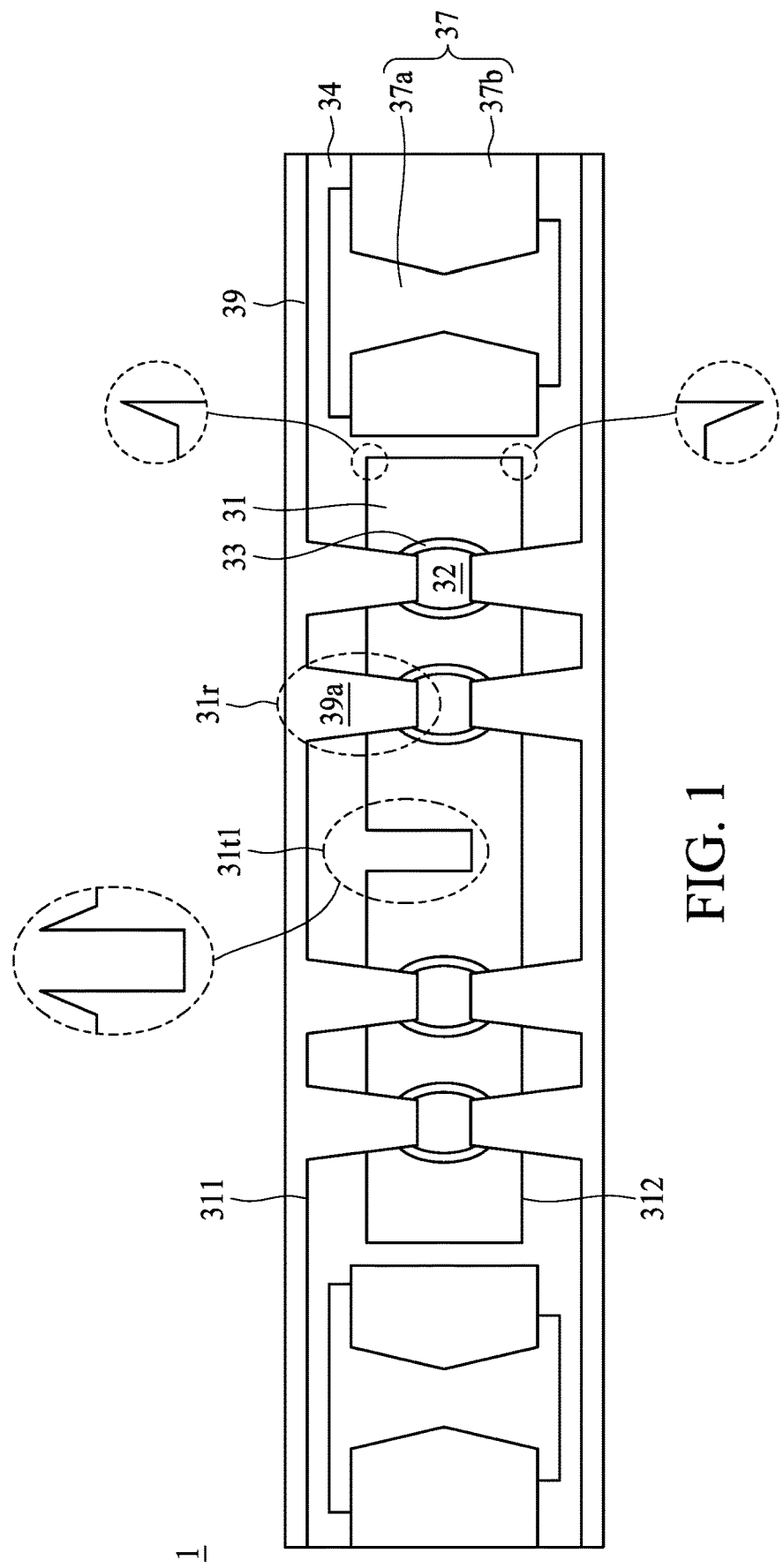
FIG. 1 illustrates a cross-sectional view of a portion of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a substrate 1 (or a portion of a semiconductor device package) in accordance with some embodiments of the present disclosure. As shown in FIG. 1, the substrate 1 includes a magnetically permeable layer 31, conductive elements 32, insulating layers 33, a dielectric layer 34, an interconnection structure 37, and a conductive layer 39.

The magnetically permeable layer 31 may include a material with high magnetic permeability and low magnetic saturation. The magnetically permeable layer 31 may be, or include, molybdenum (Mo), nickel (Ni), cobalt (Co), iron (Fe), vanadium (V), or an alloy thereof, such as, but not limited to, iron-cobalt alloy (FeCo), iron-nickel alloy (FeNi), nickel-vanadium alloy (NiV). The magnetically permeable layer 31 may be, or include, Ferrite, such as, but not limited to, ferric oxide ($Fe_2O_3$), zinc ferrite ($ZnFe_2O_4$), manganese-zinc ferrite ($Mn_aZn_{(1-a)}Fe_2O_4$) or nickel-zinc ferrite ($Ni_aZn_{(1-a)}Fe_2O_4$), Ferroalloy, such as, but not limited to, ferrosilicon (FeSi), ferrosilicon manganese (FeSiMg), iron phosphide (FeP) or iron-nickel (FeNi), magnetic adhesive or other magnetically permeable metal or metal alloy (e.g., another nickel-containing or iron-containing material), or a combination thereof. The magnetically permeable layer 31 includes a top surface 311 and a bottom surface 312 opposite to the top surface 311.

In some embodiments, the top surface 311 and the bottom surface 312 of the magnetically permeable layer 31 are not planar. For examples, as shown in the enlarged views encircled by dotted-line circles, the magnetically permeable layer 31 has burrs on the edges. For examples, the magnetically permeable layer 31 has protruding portions protruding from the top surface 311 and the bottom surface 312 of the magnetically permeable layer 31. This phenomenon may be caused during a singulation operation for manufacturing the substrate 1.

In some embodiments, in a singulation operation of the magnetically permeable layer 31, and/or a cutting operation for forming a trench 31t1 in the magnetically permeable layer 31, the magnetically permeable layer 31 of the substrate 1 is directly in contact with a cutting device. Due to the external force, the magnetically permeable layer 31 may be stretched and extended, forming burrs on the edges. In some embodiments, the burrs may hinder the pick-and-place operation (such as the operation shown in FIG. 4E), and may also cause the dielectric layer 34 uneven. Besides, the burrs may protrude from the dielectric layer 34, resulting in short-circuit.

Still referring to FIG. 1, the conductive elements 32 are surrounded, enclosed and/or embedded in the magnetically permeable layer 31. As shown in FIG. 1, the conductive elements 32 include a plurality of segments separated from each other from a side view. For examples, each of the segments is spaced apart from its adjacent segments with the magnetically permeable layer 31 interposing therebetween. Each of the segments may be, or include, a conductive material such as a metal or metal alloy. Examples include, but not limited thereto, gold (Au), silver (Ag), aluminum (Al), copper (Cu), or an alloy thereof. In some embodiments, there may be any number of segments of the conductive elements 32 depending on product specifications.

The insulating layer 33 surrounds or encloses a portion of each of the conductive elements 32 and isolates each of the conductive elements 32 from the magnetically permeable layer 31. For examples, the insulating layer 33 interposes between each of the conductive elements 32 and the magnetically permeable layer 31. As shown in FIG. 1, the insulating layer 33 is conformally disposed and covers parts of the sidewall of each of the conductive elements 32. In some embodiments, a thickness of the insulating layer 33 is substantially uniform. In some embodiments, the insulating layer 33 may be, or include, a polymer, silicon oxide, nitride oxide, gallium oxide, aluminum oxide, scandium oxide, zirconium oxide, lanthanum oxide or hafnium oxide.

The dielectric layer 34 is disposed on and in contact with the top surface 311 and the bottom surface 312 of the magnetically permeable layer 31. In some embodiments, the dielectric layer 34 may be, or include, molding compounds, pre-impregnated composite fibers (e.g., pre-preg), a polyimide (PI), an Ajinomoto build-up film (ABF), any combination thereof, or the like.

The conductive layer 39 is disposed on the dielectric layer 34. The conductive layer 39 includes conductive vias 39a penetrating the dielectric layer 34 and the magnetically preamble layer 31 to contact the conductive elements 32. For example, the conductive vias 39a are in contact with the sidewalls of the openings 31r. The conductive vias 39a are in contact with the magnetically permeable layer 31. The conductive layer 39 electrically connects one of the conductive elements 32 with other conductive element(s) 32 to define a coil, an inductor or a transformer.

In some embodiments, the conductive layer 39 may be, or include, a conductive material such as a metal or metal alloy. In some embodiments, the conductive layer 39 may include a seed layer and a metal layer. The seed layer may include, for example, titanium (Ti), Cu, Ni, another metal, or an alloy (such as a titanium-tungsten alloy (TiW)). The metal layer may include, for example, Au, Ag, Cu, Ni, palladium (Pd), another metal, a solder alloy, or a combination of two or more thereof.

The trench 31t1 recesses from the top surface 311 of the magnetically permeable layer 31. In some embodiments, the trench 31t1 may also recess from the bottom surface 312 of the magnetically permeable layer 31. The dielectric layer 34 covers and fills up the trench 31t1. For examples, the dielectric layer 34 extends from the top surface 311 and/or the bottom surface 312 into the trench 31t1. The dielectric layer 34 within the trench 31t1 interposes between the conductive elements 32, reducing the electromagnetic induction between the conductive elements 32. For examples, as shown in FIG. 1, the trench 31t1 interposes between the left two conductive elements 32 and the right two conductive elements 32. The left ones and the right ones may respectively form independent signal loops, which may generate inductive coupling and may weaken the electrical performance. With the dielectric layer 34 interposed between the signal loops of the conductive elements 32, the interference caused from the inductive coupling may be reduced. In some embodiments, the trench 31t1 may be formed deeper and/or penetrate through the magnetically permeable layer 31. In this way, the dielectric layer 34 may constitute wall from the top surface 311 to the bottom surface 312, which may bring an even better blocking ability. However, to package more than one piece of the magnetically permeable layer 31 in the device package is more time-consuming and complicated.

As mentioned, the cutting operation for forming the trench 31*t*1 in the magnetically permeable layer 31, burrs may be formed around the trench 31*t*1.

In some embodiments, there may be any number of openings 31*r* and trench 31*t*1 depending on product specifications.

Figure 3:
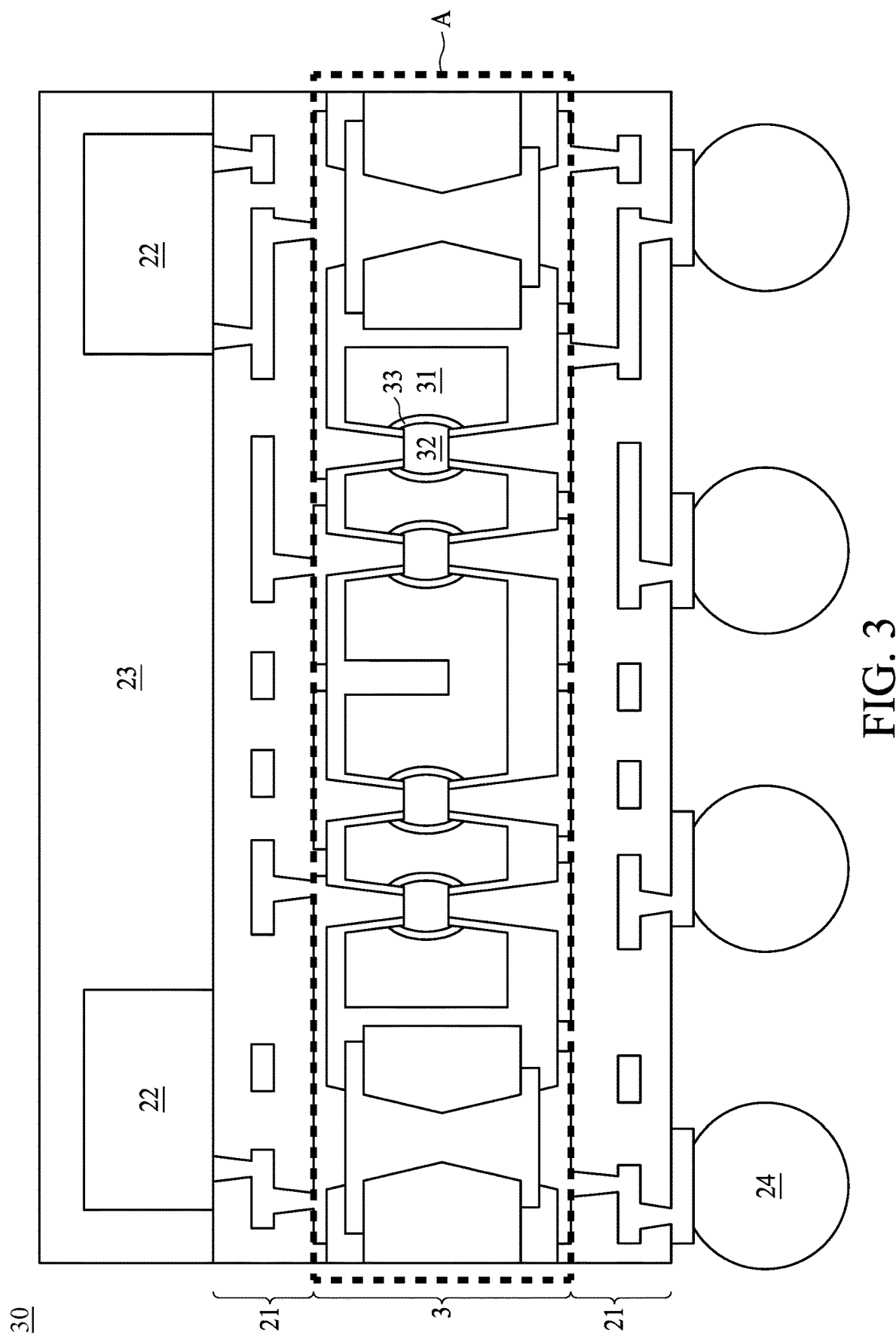
FIG. 3 illustrates a cross-sectional view of a semiconductor device package in accordance with some embodiments of the present disclosure.

The interconnection structure 37 includes a through via 37*a* and a core structure 37*b*. The through via 37*a* may include conductive material such as those described with respect to the conductive elements 32. The core structure 37*b* may include, for example, one or more organic materials (e.g., bismaleimide triazine (BT), pre-impregnated composite fibers (e.g., pre-preg), an ABF, a PI, a polybenzoxazole (PBO), a solder resist, molding compounds, an epoxy-based material, or a combination of two or more thereof), inorganic materials (e.g., silicon, a glass, a ceramic, a quartz, or a combination of two or more thereof), or a combination of two or more thereof. In some embodiments, the interconnection structure 37 may provide physical support for interconnection layers 21 (as shown in FIG. 3) and may help locating the conductive units within the interconnection layers 21 (as shown in FIG. 3). In some embodiments, the interconnection structure 37 may provide electrical connections between the substrate 1 and external components.

Figure 2:
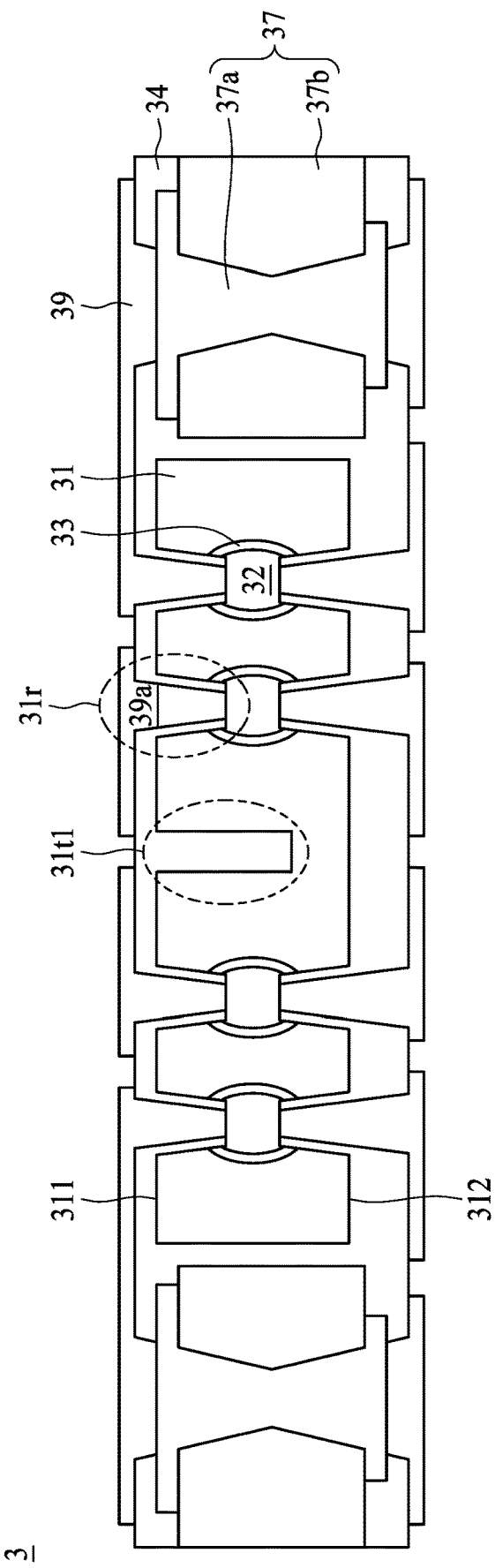
FIG. 2 illustrates a cross-sectional view of a portion of a semiconductor device package in accordance with some embodiments of the present disclosure.

FIG. 2 illustrates a cross-sectional view of a substrate 3 (or a portion of a semiconductor device package) in accordance with some embodiments of the present disclosure. The substrate 3 in FIG. 2 is similar to the substrate 1 in FIG. 1, and the differences therebetween are described below.

The dielectric layer 34 extends within the openings 31*r* of the magnetically permeable layer 31 and contact with the conductive elements 32. For example, the dielectric layer 34 is in contact with the sidewall of the openings 31*r* of the magnetically permeable layer 31. For example, the dielectric layer 34 is disposed between the conductive vias 39*a* and the sidewall of the openings 31 of the magnetically permeable layer 31*r*. For example, the conductive vias 39*a* are spaced apart from the magnetically permeable layer 31*r* by the dielectric layer 34. For examples, the openings 31*r* are filled up with the dielectric layer 34 and the conductive layer 39. For examples, the dielectric layer 34 is disposed on the sidewalls of the openings 31*r*, and the conductive layer 39 fills up the remaining portion of the openings 31*r*.

In some embodiments, the magnetically permeable layer 31, the dielectric layer 34, and the conductive layer 39 together define a double-via structure or a double-opening structure. For examples, the magnetically permeable layer 31 defines an opening (such as an outer opening) having a greater width, and the dielectric layer 34 defines another opening (such as an inner opening) having a smaller width. The opening defined by the dielectric layer 34 is inside of the opening defined by the magnetically permeable layer 31; the conductive layer 39 (or the conductive vias 39*a*) is further inside of the opening defined by the dielectric layer 34. In other words, the conductive layer 39 (or the conductive vias 39*a*) is surrounded by the dielectric layer 34 within the openings 31*r*; the dielectric layer 34 within the openings 31*r* is further surrounded by the magnetically permeable layer 31. In other words, the dielectric layer 34 within the openings 31*r* is disposed between the magnetically permeable layer 31 and the conductive layer 39 (or the conductive vias 39*a*).

As shown in FIG. 2, the conductive layer 39 is patterned such that the conductive vias 39*a* are separated from each other. However, in other embodiments, the conductive vias 39*a* may be electrically connected. For examples, the conductive vias 39*a* may be electrically connected through the other portions of the conductive layer 39.

By forming the dielectric layer 34 on the sidewalls of the openings 31*r*, the conductive via 39*a* of the substrate 3 is isolated and separated from the magnetically permeable layer 31, and is in contact with the dielectric layer 34. The adhesion between the conductive via 39*a* and the dielectric layer 34 is better (compared with the adhesion between the conductive via 39*a* and the magnetically preamble layer 31), which would increase the reliability.

In addition, the magnetically permeable layer 31 of the substrate 3 is covered by the dielectric layer 34 while being singulated and/or cut (detailed operations will be described below). For examples, another lamination operation is added before the singulation and/or cutting operation. Therefore, the magnetically permeable layer 31 is blocked and confined in the dielectric layer 34. After the singulation and/or cutting operation, the top surface 311 and the bottom surface 312 remained substantially planar as shown in FIG. 2. For examples, the surface around the trench 31*t*1 is a substantially flat and/or level surface. For examples, the surface around the edge of the magnetically permeable layer 31 is a substantially flat and/or level surface. For example, the burrs or protrusion portions occurring on the top surface 311 and the bottom surface 312 of the magnetically permeable layer 31 may be reduced and/or decreased.

FIG. 3 illustrates a cross-sectional view of a semiconductor device package 30 in accordance with some embodiments of the present disclosure. The semiconductor device package 30 includes the substrate 3 as shown in FIG. 2, interconnection layers 21, electronic components 22, an encapsulating layer 23, and electrical contacts 24.

In some embodiments, the substrate 3 may be replaced by the substrate 1 as shown in FIG. 1 depending on different design specifications. For clarity and conciseness, not all elements in the substrate 3 in FIG. 2 are marked with reference symbols.

The interconnection layers 21 are disposed on both surfaces (e.g., a top surface and a bottom surface) of the substrate 3. The interconnection layers 21 include redistribution layers (RDL), and may include conductive units (such as pads, wires, and/or vias) and a dielectric layer. A portion of the conductive units is covered or encapsulated by the dielectric layer while another portion of the conductive units is exposed from the dielectric layer to provide electrical connections for the substrate 3, the electronic components 22, and the electrical contacts 24.

In some embodiments, the interconnection layers 21 provide a fine-pitch connection. For example, the line space (L/S) may be equal to or less than 10 μm/10 μm, or equal to or less than 2 μm/2 μm. In some embodiments, for the upper interconnection layer 21 in FIG. 3, L/S may be equal to or less than 2 μm/2 μm, while the L/S for the lower interconnection layer 21 in FIG. 3 may be equal to or more than 10 μm/10 μm.

The electronic components 22 are disposed on a surface of the interconnection layer 21 facing away from the substrate 3. The electronic components 22 may include, for example, a chip or a die including a semiconductor substrate. The electronic components 22 may include one or more integrated circuit devices and one or more overlying interconnection structures. The integrated circuit devices may include active devices such as transistors and/or passive devices such as resistors, capacitors, inductors, or a combination thereof. In some embodiments, there may be any number of electronic components 22 depending on design specifications.

The encapsulating layer 23 is disposed on the interconnection layer 21 to cover or encapsulate the electronic components 22. The encapsulating layer 23 may include, for example, an epoxy resin having fillers, a molding compound (e.g., an epoxy molding compound or other molding compounds), a PI, a phenolic compound or material, a material with a silicone dispersed therein, or a combination thereof.

The electrical contacts 24 are disposed or arranged on a surface of the interconnection layer 21 facing away from the substrate 3 and can provide electrical connections between the semiconductor device package 2 and external components (e.g. external circuits or circuit boards). The electrical contacts 24 (e.g. solder balls) may include a controlled collapse chip connection (C4) bump, a ball grid array (BGA) or a land grid array (LGA). In some embodiments, the electrical contacts 24 can be used for a fan-in structure, a fan-out structure, or a combination of the fan-in and fan-out structure. In some embodiments, there may be any number of electrical contacts 24 depending on design specifications.

FIG. 4A, FIG. 4B, FIG. 4C, FIG. 4D, FIG. 4E, FIG. 4F, FIG. 4G, FIG. 4H, 4I and FIG. 4J, are cross-sectional views of a semiconductor device package at various stages of fabrication, in accordance with some embodiments of the present disclosure. At least some of these figures have been simplified for a better understanding of the aspects of the present disclosure.

Figure 4A:
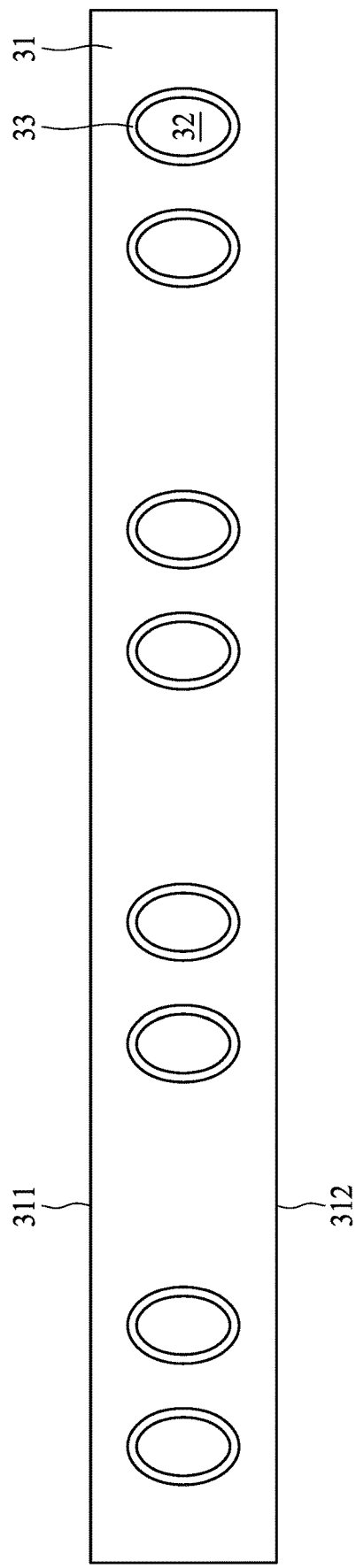
FIG. 4A illustrates one or more stages of a method of manufacturing a semiconductor device package in accordance with some embodiments of the present disclosure.

Referring to FIG. 4A, a magnetically permeable layer 31 is provided. The magnetically permeable layer 31 includes a top surface 311 and a bottom surface 312 opposite to the top surface 311. In some embodiments, the top surface 311 is substantially planar. In some embodiments, the bottom surface 312 is substantially planar. Conductive elements 32 are surrounded, enclosed, and/or embedded in the magnetically permeable layer 31. An insulating layer 33 surrounds each of the conductive elements 32 and isolates each of the conductive elements 32 from the magnetically permeable layer 31.

Figure 4B:
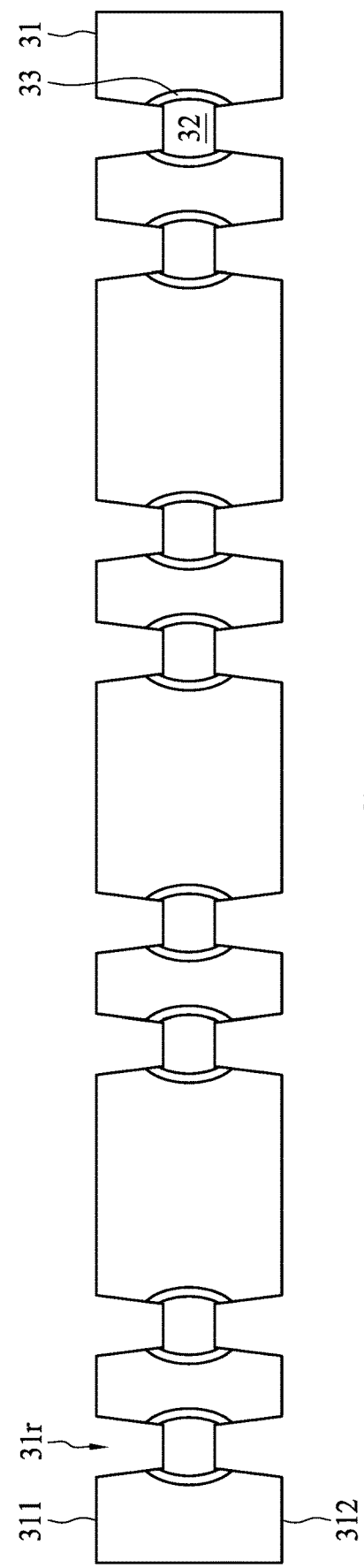
FIG. 4B illustrates one or more stages of a method of manufacturing a semiconductor device package in accordance with some embodiments of the present disclosure.

Referring to FIG. 4B, a portion of the magnetically preamble layer 31 and the insulating layers 33 are removed to form openings 31r to expose parts of the conductive elements 32 and/or the insulating layers 33. In some embodiments, the openings 31r can be formed by drilling, laser drilling or etching. After the operation, the conductive elements 32 are exposed from the bottoms of the openings 31r defined by the magnetically permeable layer 31. The insulating layers 33 are exposed from the sidewalls of the openings 31r defined by the magnetically permeable layer 31.

Figure 4C:
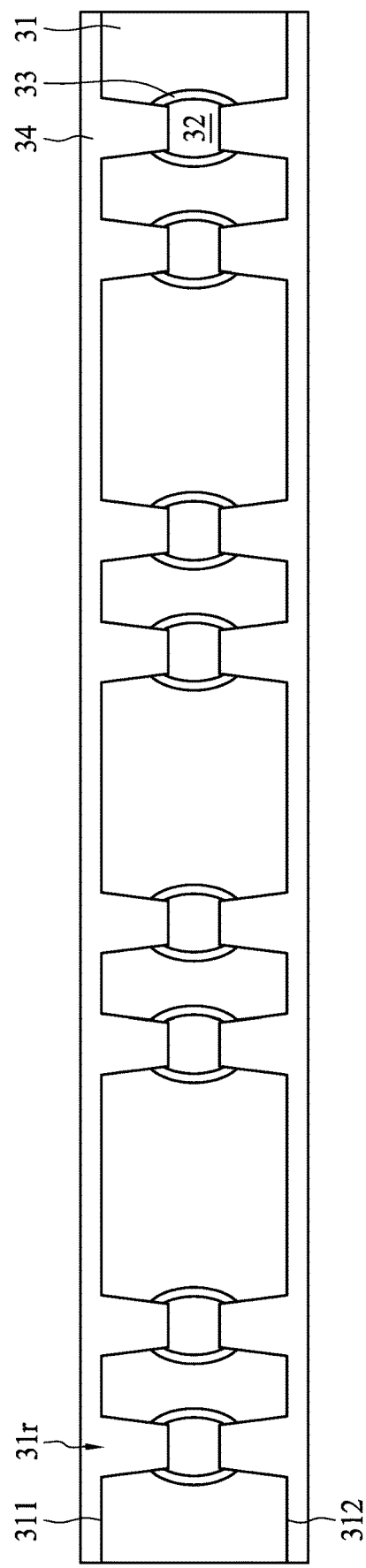
FIG. 4C illustrates one or more stages of a method of manufacturing a semiconductor device package in accordance with some embodiments of the present disclosure.

Referring to FIG. 4C, a dielectric layer 34 is disposed on the top surface 311 and the bottom surface 312 of the magnetically permeable layer 31. The dielectric layer 34 is also disposed within the openings 31r and on the exposed portion of the conductive elements 32. For example, the dielectric layer 34 is in contact with the sidewall of the openings 31r and the exposed portion of the conductive elements 32. In some embodiments, the dielectric layer 34 is further in contact with the exposed portion of the insulation layers 33. In some embodiments, the dielectric layer 34 may be formed by, for example, coating, lamination or other suitable processes.

Figure 4D:
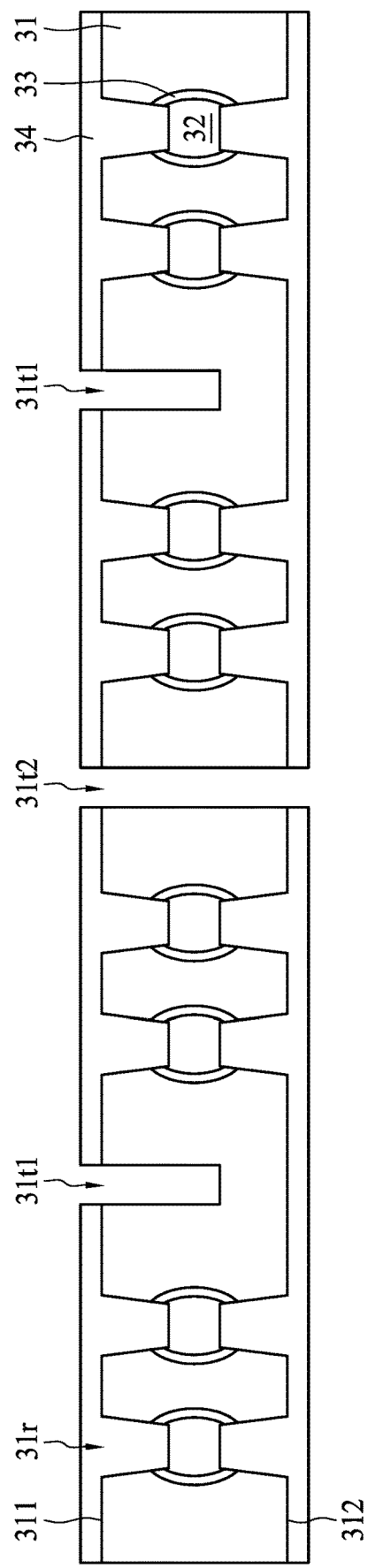
FIG. 4D illustrates one or more stages of a method of manufacturing a semiconductor device package in accordance with some embodiments of the present disclosure.

Referring to FIG. 4D, a trench 31t1 (e.g., a half-cutting trench) and/or a trench 31t2 (e.g., a full-cutting trench) are formed. A singulation operation (e.g., by using a dicing saw, laser, punching machine or other appropriate cutting technique) is conducted to form the trench 31t2 and to singulate or cut the magnetically permeable layer 31 into two discrete segments. In some embodiments, the trench 31t1 may be formed prior to or after the formation of the trench 31t2. In some embodiments, the trenches 31t1 and the trench 31t2 are formed in the same operation.

As mentioned, the magnetically permeable layer 31 is covered by the dielectric layer 34 while being singulated and/or cut, and thus the magnetically permeable layer 31 is blocked and confined in the dielectric layer 34. After the trench 31t1 and/or the trench 31t2 are formed, the top surface 311 and/or the bottom surface 312 of the magnetically permeable layer 31 remained substantially planar (e.g., burrs or protrusion portions may be reduced and/or decreased). In some embodiments, there may be any number of segments of the magnetically permeable layer 31 depending on design specifications.

Figure 4E:
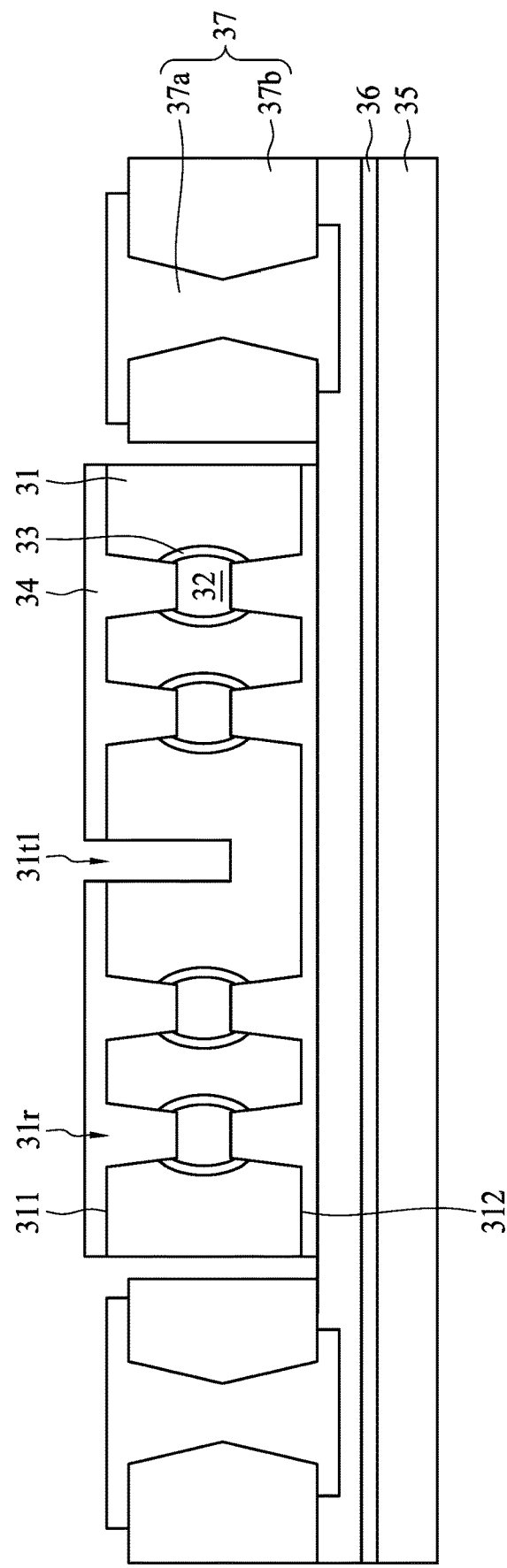
FIG. 4E illustrates one or more stages of a method of manufacturing a semiconductor device package in accordance with some embodiments of the present disclosure.

Referring to FIG. 4E, one of the segments of the magnetically permeable layer 31 singulated from the singulation operation is attached on a carrier 35 through an adhesive layer 36. Interconnection structures 37 are also attached on a carrier 35 through an adhesive layer 36. In some embodiments, the carrier 35 may include a ceramic material, a metal plate, or other plate for supporting the magnetically permeable layer 31 and the interconnection structure 37. In some embodiments, the adhesive layer 36 may include glue or other intermediate layers for attaching. In some embodiments, there may be any number of segments of the magnetically permeable layer 31 attached on the carrier 35 depending on design specifications.

Figure 4F:
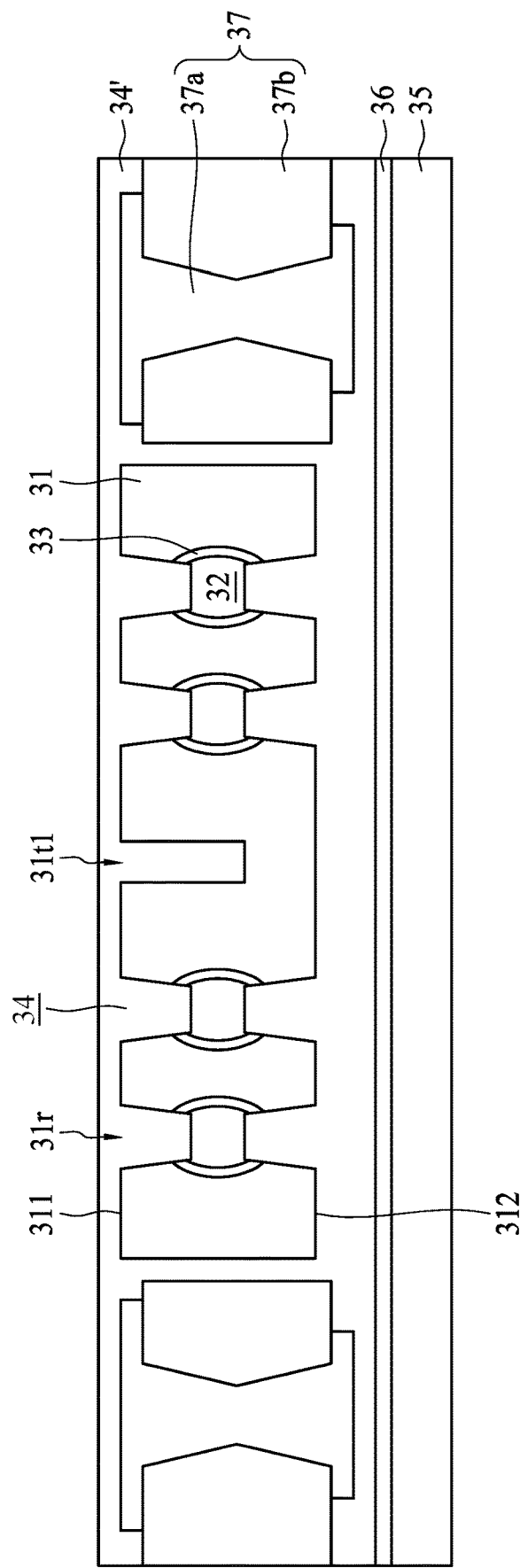
FIG. 4F illustrates one or more stages of a method of manufacturing a semiconductor device package in accordance with some embodiments of the present disclosure.

Referring to FIG. 4F, a dielectric layer 34' is disposed the carrier 35 to cover the magnetically permeable layer 31 and the interconnection structure 37. The dielectric layer 34' fills up the trench 31t1 and the gap between the interconnection structure 37 and the magnetically permeable layer 31. The dielectric layer 34' and the dielectric layer 34 may include the same material. Alternatively, the dielectric layer 34' and the dielectric layer 34 may include different materials. In some embodiments, the dielectric layer 34' may be formed by, for example, coating, lamination or other suitable processes.

Figure 4G:
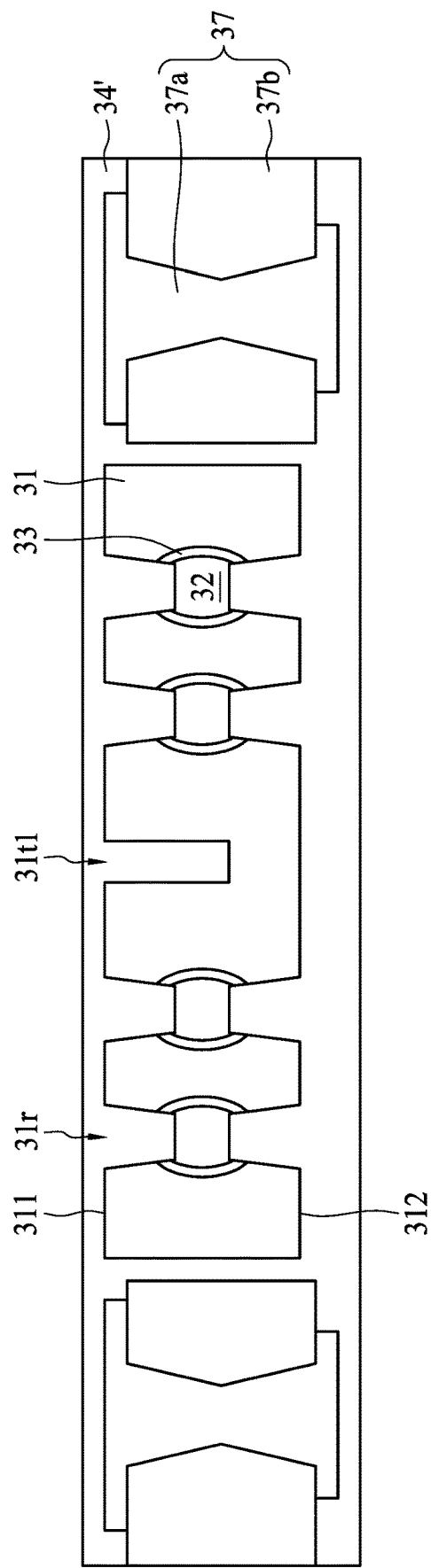
FIG. 4G illustrates one or more stages of a method of manufacturing a semiconductor device package in accordance with some embodiments of the present disclosure.

Referring to FIG. 4G, the carrier 35 and the adhesive layer 36 are removed from the magnetically permeable layer 31.

Figure 4H:
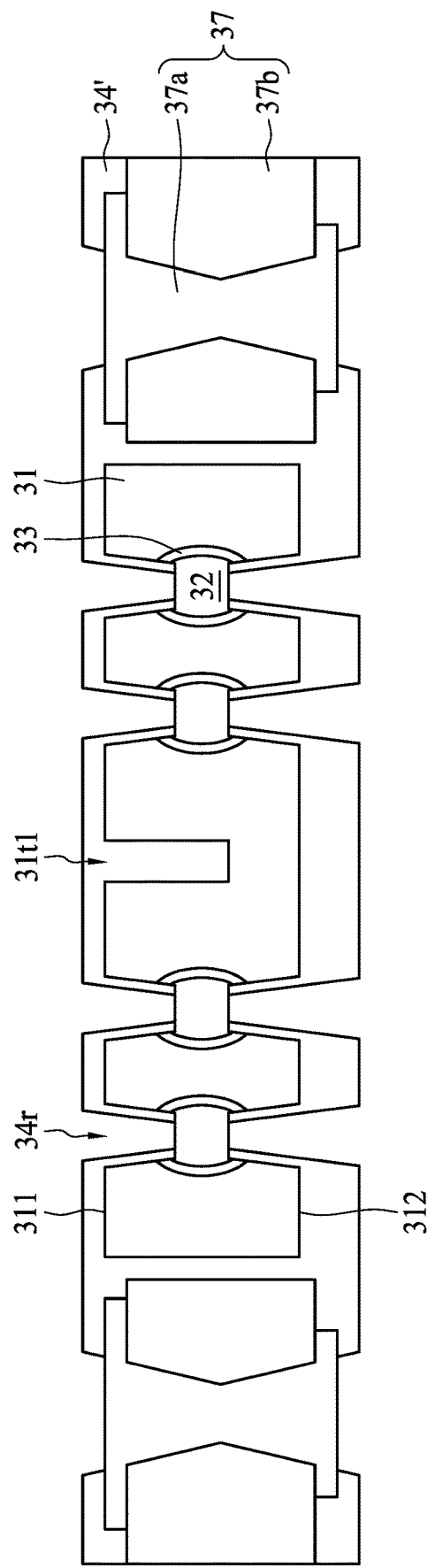
FIG. 4H illustrates one or more stages of a method of manufacturing a semiconductor device package in accordance with some embodiments of the present disclosure.

Referring to FIG. 4H, openings 34r are formed to expose parts of the conductive elements 32. In some embodiments, the openings 34r can be formed by drilling, laser drilling or etching. After the operation, the conductive elements 32 are exposed from the bottoms of the openings 34r defined by the dielectric layer 34. The openings 34r defined in the dielectric layer 34 as shown in FIG. 4H has a width smaller than a width of the openings 31r defined in the magnetically permeable layer 31 as shown in FIG. 4B. In some embodiments, the dielectric layer 34 is patterned to expose parts of the through vias 37a.

Figure 4I:
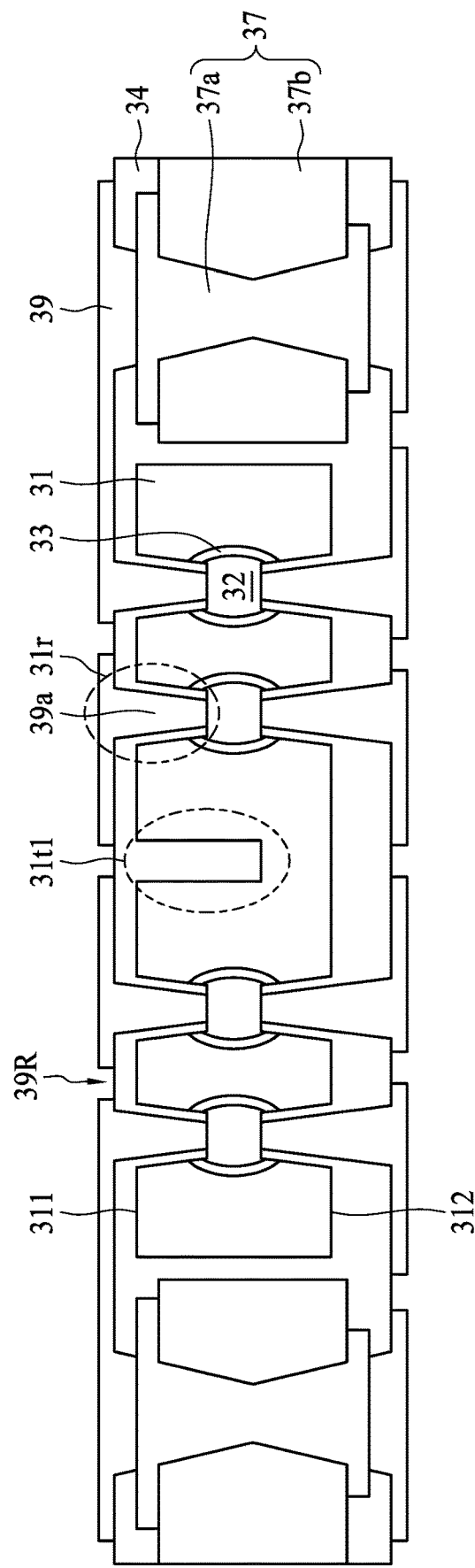
FIG. 4I illustrates one or more stages of a method of manufacturing a semiconductor device package in accordance with some embodiments of the present disclosure.

Referring to FIG. 4I, a conductive layer 39 is disposed on the dielectric layer 34. The conductive layer 39 is also disposed within the openings 34r defined by the dielectric layer 34 and on top of the exposed conductive elements 32. In some embodiments, the conductive layer 39 may include a seed layer and a metal layer. In some embodiments, the seed layer may be formed by sputtering titanium and copper (Ti/Cu) or a TiW. In some embodiments, the seed layer may be formed by electroless plating Ni or Cu. In some embodiments, the metal layer may be formed by plating Cu, Ag, Ni, Au, or another metal. In some embodiments, the metal layer may be formed by electroless plating Cu, Ni, Pb, or another metal. In some embodiments, the metal layer may be formed by printing Cu, Ag, Au, or another metal. Then, the conductive layer 39 is patterned to form recesses 39r to expose parts of the dielectric layer 34. The structure in FIG. 4I is similar to the substrate 3 in FIG. 3.

Figure 4J:
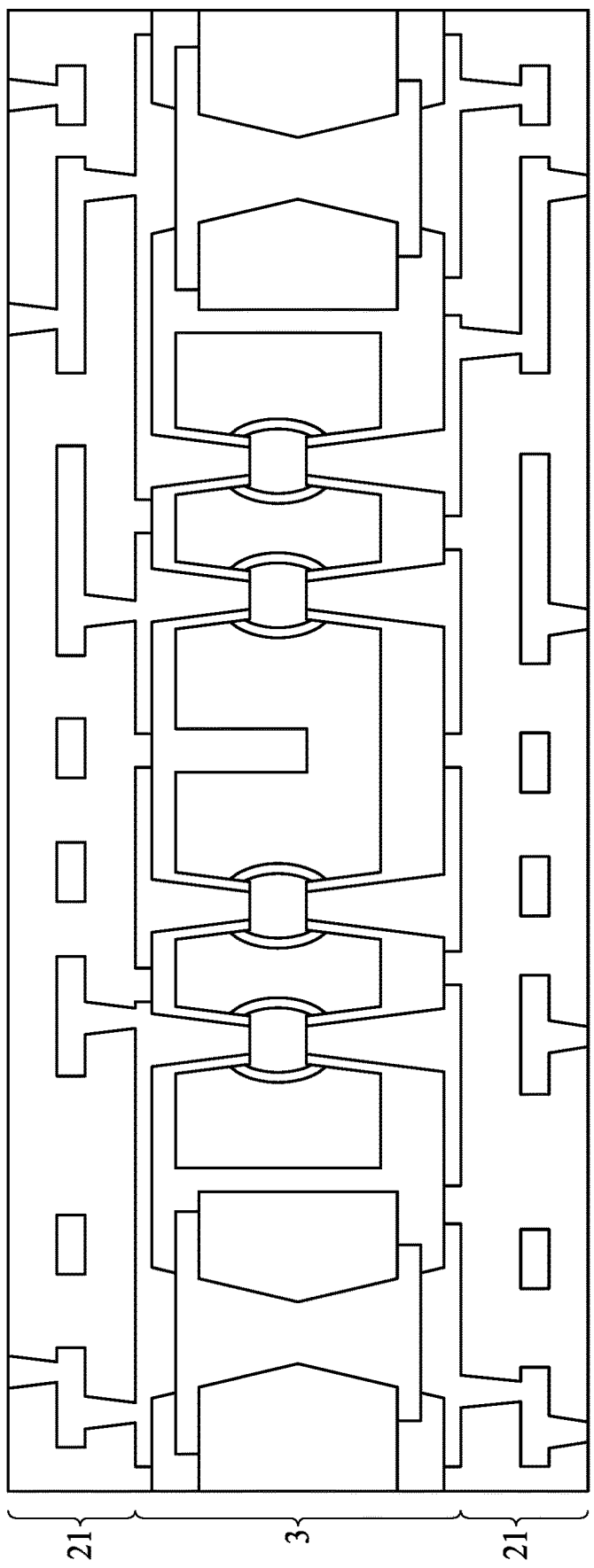
FIG. 4J illustrates one or more stages of a method of manufacturing a semiconductor device package in accordance with some embodiments of the present disclosure.

Referring to FIG. 4J, interconnection layers 21 are provided on both sides of the substrate 3. In some embodiments, the interconnection layers 21 may be formed through patterning a photoresist film (or a mask) by, for examples, lithographic technique, to expose a portion of the dielectric layer. Conductive units may be formed by, for examples, sputtering, electroless plating, printing, or other suitable processes.

In some embodiments, one or more electronic components (such as the electronic components 22 in FIG. 3) are disposed on a surface of the interconnection layer 21 facing away from the substrate 3 by a capillary or through other tools. In some embodiments, the electronic components may be disposed on an adhesive layer, glue or other intermediate layers for die-attaching. In some embodiments, an encapsulating layer (such as the encapsulating layer 23 in FIG. 3) is disposed on the interconnection layer 21 to cover or encapsulate the electronic components. In some embodiments, the encapsulating layer may be formed by a molding technique, such as transfer molding or compression molding. In some embodiments, one or more electrical contacts (such as the electrical contacts 24 in FIG. 3) may be provided on a surface of the interconnection layer 21 facing away from the substrate 3.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. An embedded component package structure, comprising:
    a magnetically permeable layer having a top surface and a bottom surface opposite to the top surface;
    a first conductive element in the magnetically permeable layer;
    a first conductive via extending from the top surface of the magnetically permeable layer into the magnetically permeable layer to be electrically connected to the first conductive element; and
    a dielectric layer covering the magnetically permeable layer, wherein the first conductive via is separated from the magnetically permeable layer by the dielectric layer.

2. The embedded component package structure of claim 1, further comprising:
    a second conductive element in the magnetically permeable layer and spaced apart from the first conductive element; and
    a second conductive via extending from the top surface of the magnetically permeable layer into the magnetically permeable layer to be electrically connected to the second conductive element,
    wherein the second conductive via is separated from the magnetically permeable layer by the dielectric layer.

3. The embedded component package structure of claim 2, further comprising a conductive layer disposed on the top surface of the magnetically permeable layer and electrically connecting the first conductive via with the second conductive via.

4. The embedded component package structure of claim 1, wherein the dielectric layer is in contact with a portion of the first conductive element.

5. The embedded component package structure of claim 1, further comprising a trench recessing from the top surface of the magnetically permeable layer into the magnetically permeable layer, wherein the trench is filled up with the dielectric layer.

6. The embedded component package structure of claim 1, wherein the first conductive via is in contact with the first conductive element.

7. The embedded component package structure of claim 1, further comprising an interconnection layer disposed on at least one of the top surface and the bottom surface of the magnetically permeable layer and electrically connected with the first conductive via.

8. The embedded component package structure of claim 7, further comprising an interconnection structure disposed adjacent to the magnetically permeable layer and electrically connected with the interconnection layer.

9. A semiconductor device package, comprising:
    a magnetically permeable layer having a top surface and a bottom surface opposite to the top surface;
    a first conductive element in the magnetically permeable layer;
    an opening extending from the top surface of the magnetically permeable layer to expose a portion of the first conductive element;
    a first conductive via disposed within the opening and electrically connected to the exposed portion of the first conductive element; and
    a dielectric layer covering the magnetically permeable layer and on a sidewall of the opening.

10. The semiconductor device package of claim 9, wherein the dielectric layer surrounds the first conductive via.

11. The semiconductor device package of claim 9, wherein the dielectric layer is in contact with the exposed portion of the first conductive element.

12. The semiconductor device package of claim 9, further comprising an insulating layer between the magnetically permeable layer and the first conductive element.

13. The semiconductor device package of claim 9, wherein at least one of the top surface and the bottom surface of the magnetically permeable layer is substantially planar.

14. The semiconductor device package of claim 9, further comprising:
 a second conductive element in the magnetically permeable layer and spaced apart from the first conductive element; and
 a second conductive via extending from the top surface of the magnetically permeable layer into the magnetically permeable layer to be electrically connected to the second conductive element,
 wherein the second conductive via is separated from the magnetically permeable layer by the dielectric layer.

15. The semiconductor device package of claim 14, further comprising a conductive layer disposed on the top surface of the magnetically permeable layer and electrically connecting the first conductive via with the second conductive via.

16. The semiconductor device package of claim 14, further comprising a trench recessing from the top surface of the magnetically permeable layer into the magnetically permeable layer, wherein the trench is filled up with the dielectric layer.

17. A method of manufacturing a semiconductor device package, comprising:
 providing a structure including a magnetically permeable layer having a top surface, a bottom surface opposite to the top surface, and a conductive element enclosed in the magnetically permeable layer;
 forming a first opening to expose a part of the conductive element; and
 forming a dielectric layer covering the magnetically permeable layer and within the first opening.

18. The method of claim 17, further comprising:
 removing a part of the dielectric layer in the first opening to form a second opening to expose a part of the conductive element.

19. The method of claim 18, further comprising:
 forming a conductive via within the second opening to be electrically connected with the conductive element.

20. The method of claim 18, wherein a width of the first opening is greater than a width of the second opening.

21. The method of claim 17, further comprising:
 cutting through the dielectric layer and the magnetically permeable layer to form at least two segments.

22. An embedded component package structure, comprising:
 a magnetically permeable layer having a top surface and a bottom surface opposite to the top surface;
 a first conductive element in the magnetically permeable layer;
 a first conductive via extending from the top surface of the magnetically permeable layer into the magnetically permeable layer to be electrically connected to the first conductive element, wherein the first conductive via is separated from the magnetically permeable layer; and
 an insulating layer between the magnetically permeable layer and the first conductive element.

* * * * *